United States Patent [19]

Kim et al.

[11] Patent Number: 5,467,316

[45] Date of Patent: Nov. 14, 1995

[54] DEVICE AND METHOD OF REDUCING WORD LINE RESISTANCE OF A SEMICONDUCTOR MEMORY

[75] Inventors: Hyeun-Su Kim, Suwon; Dong-Jae Lee, Seoul, both of Rep. of Korea

[73] Assignee: SamSung Electronics Co., Ltd., Suwon, Rep. of Korea

[21] Appl. No.: 983,475

[22] Filed: Dec. 3, 1992

[30] Foreign Application Priority Data

Dec. 4, 1991 [KR] Rep. of Korea .................. 22107/1991

[51] Int. Cl.⁶ .............................. G11C 8/00; G11C 7/00
[52] U.S. Cl. .................... 365/230.06; 365/63; 365/104
[58] Field of Search .............................. 365/63, 230.06, 365/149, 104, 203.06

[56] References Cited

U.S. PATENT DOCUMENTS

| | | | |
|---|---|---|---|
| 4,883,980 | 11/1989 | Morimoto et al. | 307/465.1 |
| 4,906,872 | 3/1990 | Tanaka | 307/480 |
| 4,926,378 | 5/1990 | Uchida et al. | 365/149 |
| 4,958,092 | 9/1990 | Tanaka | 307/480 |
| 5,053,993 | 10/1991 | Miura | 365/104 |
| 5,075,890 | 12/1991 | Itoh et al. | 365/189.09 |
| 5,097,440 | 3/1992 | Konishi et al. | 365/63 X |
| 5,097,441 | 3/1992 | Cho et al. | 365/63 X |
| 5,148,401 | 9/1992 | Sekino et al. | 365/230.06 |
| 5,172,335 | 12/1992 | Sasaki et al. | 365/63 |

FOREIGN PATENT DOCUMENTS

| | | |
|---|---|---|
| 2-156666 | 7/1988 | Japan. |
| 1-245489 | 10/1988 | Japan. |
| 3-235290 | 5/1990 | Japan. |

*Primary Examiner*—David C. Nelms
*Assistant Examiner*—Son Dinh
*Attorney, Agent, or Firm*—Robert E. Bushnell

[57] ABSTRACT

A semiconductor memory device with a memory array of cells formed as a matrix has bit lines, and word lines driven by word line drivers, where each of the word line drivers simultaneously selects and drives at least two word lines in order to minimize line resistances of the word lines, thereby minimizing a delay time and improving a speed of sensing a cell data. Accordingly a number of the word line drivers is at least one-half a number of the word lines.

14 Claims, 6 Drawing Sheets

DEVICE AND METHOD OF REDUCING WORD LINE RESISTANCE OF A SEMICONDUCTOR MEMORY

BACKGROUND OF THE INVENTION

The present invention relates to a semiconductor memory device, and more particularly, to an improved word line and driver structure for a dynamic random access memory with an open bit line structure.

Semiconductor memory devices are highly integrated; consequently, the most frequently adopted method for increasing the chip density within a restricted area is to minimize the size of the memory cell which includes one storage capacitor for storing data and one access transistor for transferring the data through bit lines. This however, causes a reduction of the pitch of the bit lines and the pitch of the word lines for selecting the memory cells, where the pitch is defined as the space between the lines. The area on which bit line selectors, bit line selection drivers, word line selectors, and word line selection drivers are arranged may be concomitantly and undesirably reduced however, thereby causing numerous problems. Generally, word line drivers are directly related to the sensing operation for the transfer of data by controlling the access transistor of the memory cell; accordingly, effective design and layout of the word line drivers is very important.

In a conventional folded bit line structure each of the word lines is coupled to a corresponding word line driver. The number of word line selectors is proportional to the number of the word line drivers with one word line selector connected to four word line drivers. The word lines in a group are connected to corresponding word line drivers, and the word line drivers are each controlled by a word line selector that is, in turn controlled by a word line selection signal. Such a conventional structure is difficult to design and layout in a semiconductor memory device using a design rule appropriate for design at a sub-micron level (e.g., for a very large scale integration memory device over the 64 megabyte level) of a dynamic random access memory. Furthermore, an increase in the density of the memory device requires reduction of the pitch between the word lines, thereby increasing the word line resistance. The word lines effect each other by noises generated from adjacent word lines which have their own specific resistances and junction capacitances.

A conventional semiconductor chip usually has first metal resistances arranged in parallel with the word lines. The width of the word lines, made of layers of polysilicon forming the gate electrodes of the single transistor memory cells, has been gradually reduced to obtain an increase in the density of the chip, thereby causing increased line resistance since resistance of the word line is inversely proportional to the width of the word line. A strap region indicates a region where a substance such as metal is arranged in the word lines, (i.e., strapped over a given length) in order to minimize the delay time of a transfer signal via the word lines. In addition, the word line resistances increase in proportion to the number of word lines on the chip, which consequently decreases the speed at which data stored in the memory cells may be sensed.

SUMMARY OF THE INVENTION

It is therefore, an object of the present invention to provide an improved word line and word line driver configuration, and a process for making the improved configuration.

It is another object to provide a word line, word line driver configuration, and process of manufacture that minimizes word line resistance.

It is yet another object to provide a word line, word line driver configuration, and process, able to select memory cells at an enhanced speed.

It is still another object to provide a word line, word line driver configuration, and process for manufacture, exhibiting reduced word line resistance and enhanced speed of memory cell selection.

It is still yet another object to provide a word line, word line driver configuration, and process for simultaneously selecting memory cells via adjacent pairs of word lines.

It is further an object to provide a process for making a semiconductor memory device for coupling an end of two word lines to enable connection of the coupled word lines to a single word line driver.

These and other objects may be achieved according to the principles of the present invention, with a semiconductor memory device using a memory array formed as a matrix having word lines and bit lines for selecting a memory cell. As contemplated, the device includes word lines and word line drivers so arranged that each of the word line drivers simultaneously selects and drives two adjacent word lines in order to minimize the line resistances of the word lines, thereby improving the speed of sensing the memory cell data. Accordingly, the number of word line drivers is one-half of the number of word lines formed on the chip.

The present invention will now be described more specifically with reference to the drawings attached, only by way of example of the principles of invention disclosed.

BRIEF DESCRIPTION OF THE ATTACHED DRAWINGS

DETAILED DESCRIPTION OF A PREFERRED EMBODIMENT

Figure 1:
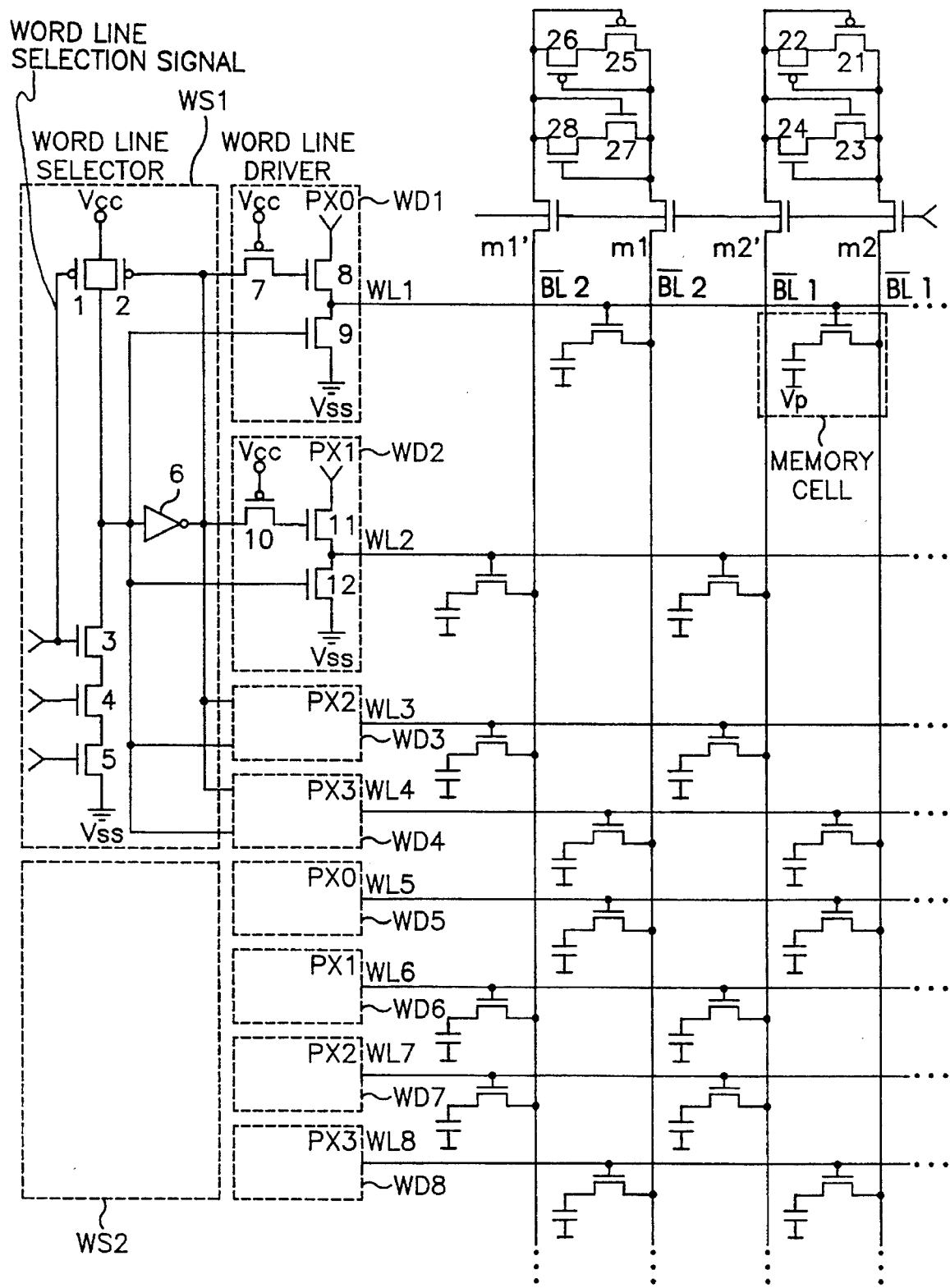
FIG. 1 shows the structure of the word lines and word line drivers constructed according to a conventional method.

FIG. 1 shows a memory device having a conventional folded bit line structure in which each of the word lines WL1, WL2, WL3, ... WL8, is coupled to a corresponding word line driver WD1, WD2, WD3, ... WD8. Moreover, the number of the word line selectors WS1, WS2 is proportional to the number of the word line drivers WD1, WD2, ... WD8. As is shown in FIG. 1, one word line selector is connected to four word line drivers, and the word lines WL1, WL2, WL3 ... WL8 in each group are respectively connected to different individual ones of the word line drivers WD1, WD2, WD3 ... WD8, respectively. Each of the word line drivers is controlled by a word line selector that is, in turn, controlled by a word line selection signal. Such a structure is difficult to design and layout in a semiconductor memory device when using a design rule appropriate for design of semiconductor devices at a sub-micron level such as a very large scale integration memory device on the order of, or greater than a 64 megabyte dynamic random access memory. Furthermore, an increase of the density of the memory device requires reduction of the pitch between the word lines, which concomitantly increases the word line resistance. It should be noted that the word lines effect each other by noise generated by adjacent word lines having their own specific resistances and junction capacitances.

Figure 2:
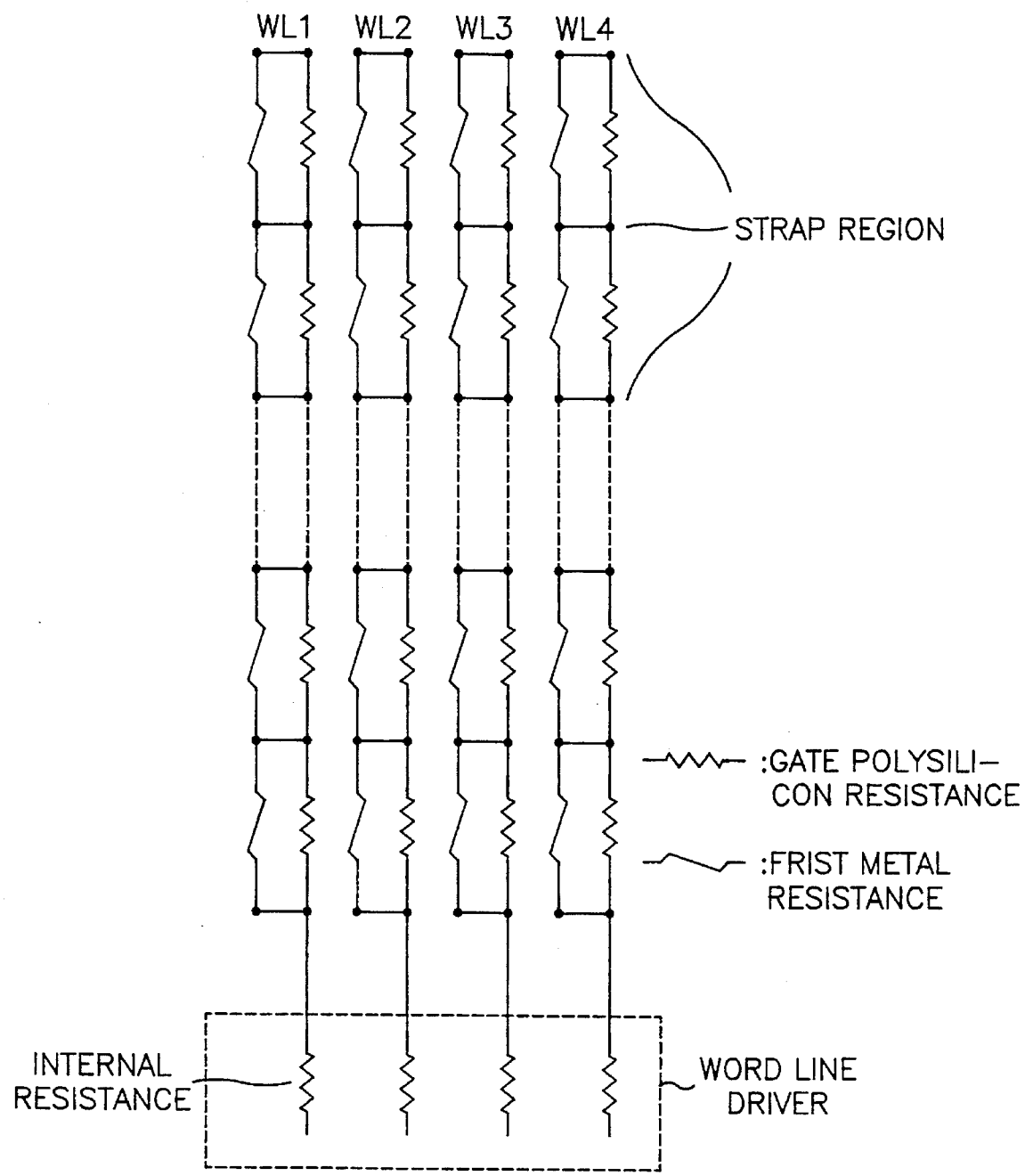
FIG. 2 is a schematic diagram illustrating resistance components of the word lines shown in FIG. 1.

As is shown in FIG. 2, a semiconductor chip usually has a plurality of serially connected first metal resistances $R_m$ formed by first metal layers deposited in parallel with corresponding polycyrstalline silicon layers (i.e., polysilicon) forming the gate electrode terminals of the single transistors of the memory cells shown in FIG. 1 coupled to the word lines. The widths of the word lines, defined by the gate polysilicon layers, are gradually reduced with an increase in the density of the chip, causing thereby increased line resistance since resistance of the word line is inversely proportional to the width of the word line. A strap region indicates a length of the word line where a substance such as a layer of metal deposited in the word lines, is strapped over a given length of the corresponding word line in order to minimize delay time of a transfer signal via the word lines. In addition, the word line resistances increase in proportion to the number of word lines on the chip, which consequently decreases the speed of sensing data stored in the memory cells.

Figure 3:
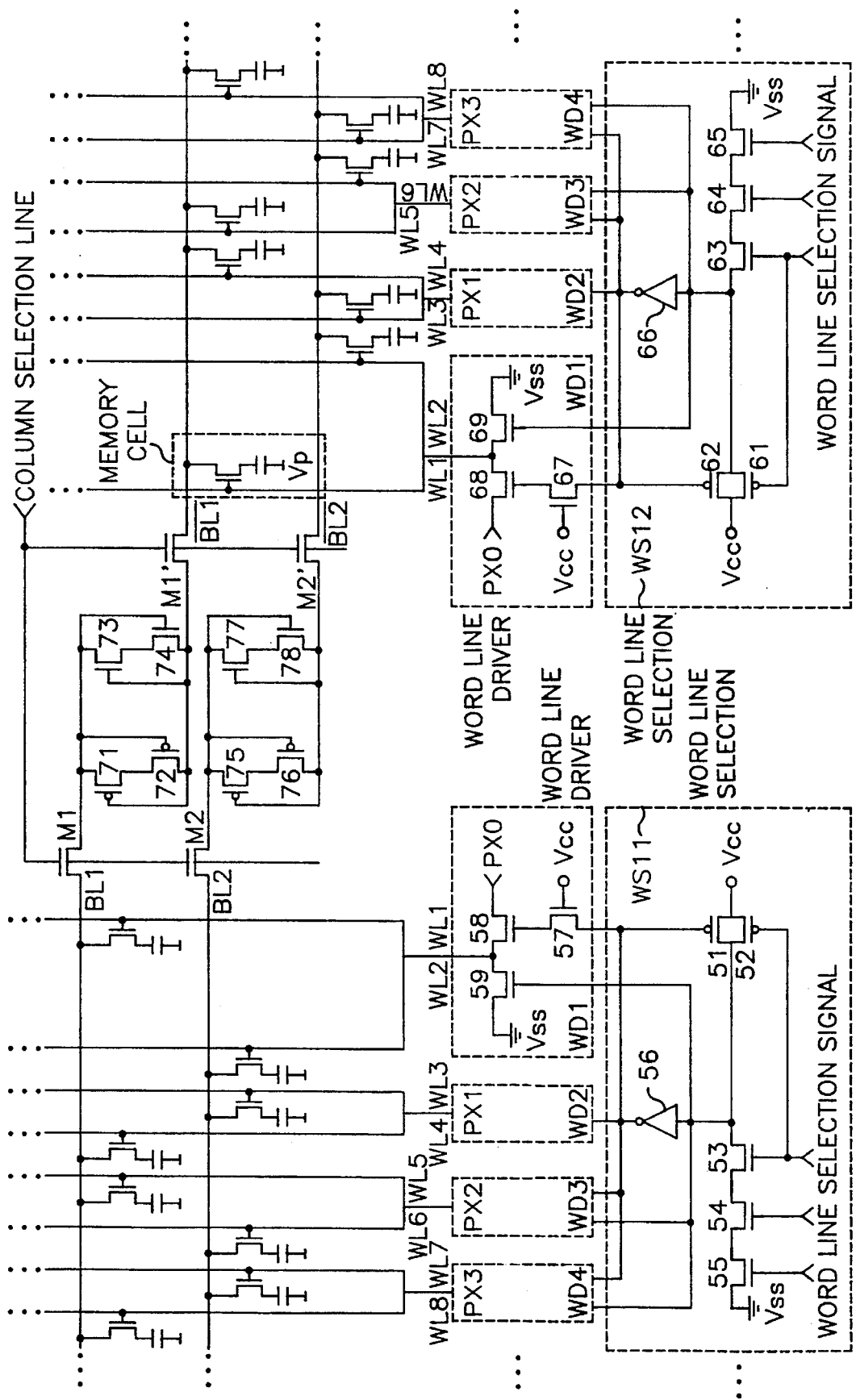
FIG. 3 shows a structure of the word lines and word line drivers as constructed according to the principles of the present invention.

Referring now to FIG. 3, it should be noted that the principles of the present invention may be applied to a semiconductor memory device of the type having an open bit line structure. The internal circuit structure of the word line selectors WS11, WS12, ... and word line drivers WD1, WD2, WD3, ... is the same as those of FIG. 1, and therefore the descriptions for those word line selectors and word line drivers need not be repeated here. One key feature of the present invention is that one word line driver is able to select and drive one of two word lines, thereby reducing word line resistance while concomitantly reducing the number of word line drivers needed in a semiconductor memory device.

Figure 5:
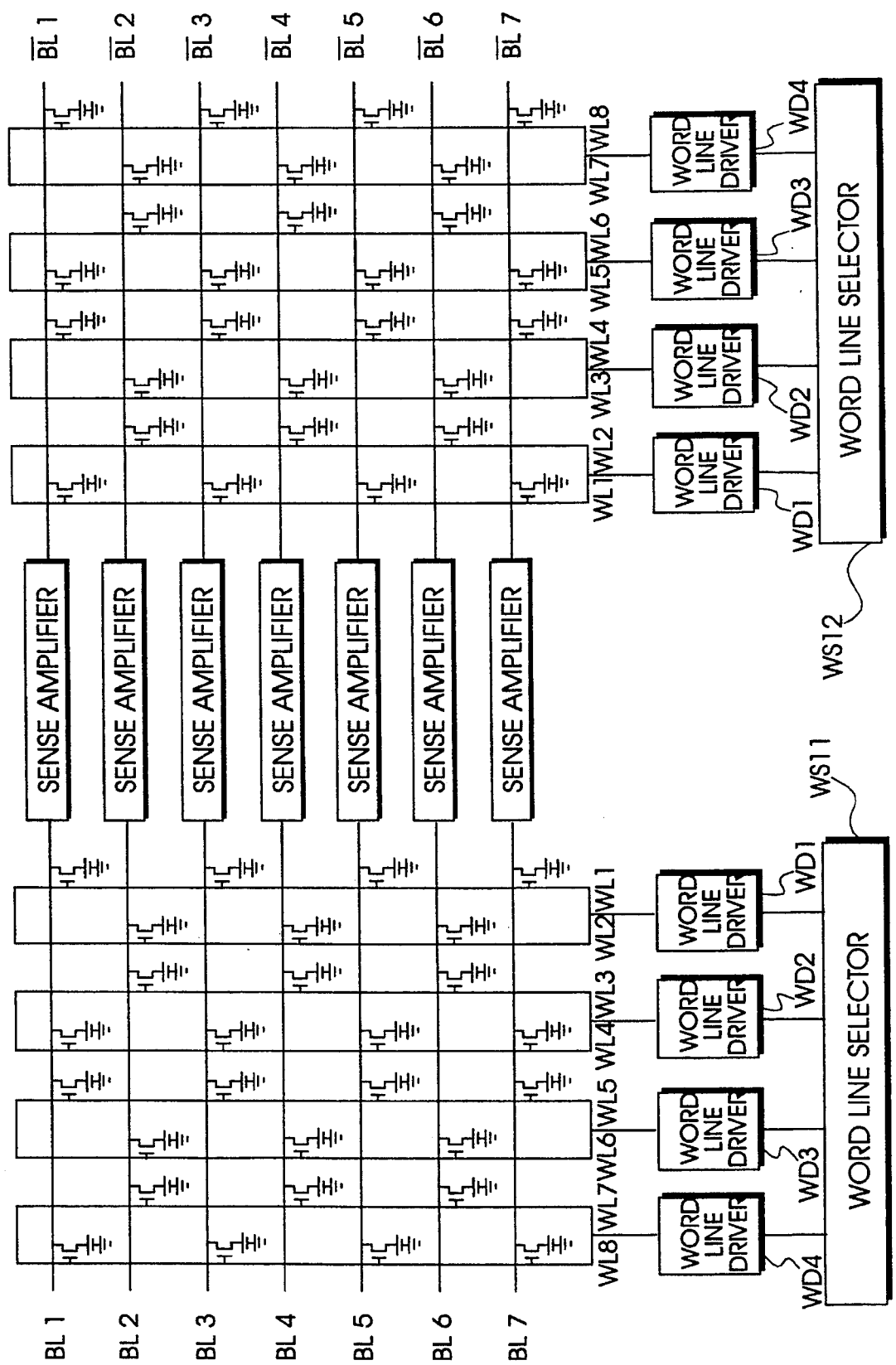
FIG. 5 illustrates a plan view on a memory cell matrix constructed according to the principles of the present invention.

In the device represented by FIGS. 3 and 5, a column selector line signal selects one of the sense amplifiers 71, 72, 73, ... 78 respectively connected to a number of memory cells in the column. The memory cells are arranged in a matrix array, and are connected with corresponding selected word lines. The selected sense amplifier senses, in a conventional manner, data stored in the memory cell located where the bit line connected to the sense amplifier intersects with the selected word line. In this embodiment, one word line selector in a group of word line selectors may be selected by a combination of word line select signals, and the word line which is selected can, in turn, select four word line drivers. When a word line driver such as WD1 is activated, two word lines WL1 and WL2 are selected at the same time. In like manner, if word line driver WD2 is activated, word lines WL3 and WL4 are selected. Data stored in the single transistor memory cells having gate electrodes coupled to word lines WL1, WL2 are transferred to the corresponding sense amplifiers formed by transistors 75–78 and 71–74, respectively, at the same time, and unwanted data stored in the memory cells in word line WL2, for example, may be eliminated with peripheral circuitry (not shown in FIGS. 3 and 5).

In the word line selector WS12, transistors 63, 64, 64 are all turned to an electrically conducting ON state by a binary selection signal of 111 applied to the gate electrodes of transistors 63, 64, 65, to enable selection of word lines WL1, WL2. After a short interval, if a binary selection signal 000 is applied to transistors 63, 64, 65, transistors 61, 62 are turned to an electrically conducting ON state, while inverter 66 and transistor 62 form a latch circuit to maintain the current logic state. Transistor 69 is turned to either an electrically conducting ON state or to an electrically non-conducting OFF state according to the logic state of the signal applied to the gate electrode of transistor 69. At this time, word line driver stage WD1 is not turned ON because transistor 69 is turned to an electrically conducting ON state. Subsequently however, if the binary selection signal 111 is again applied to the gate electrodes of transistors 63, 64, 65, word line driver WD1 will be activated because transistors 61, 62 and 69 will be turned to an electrically non-conducting OFF state while transistor 68 will be in an electrically conducting ON state.

Figure 4:
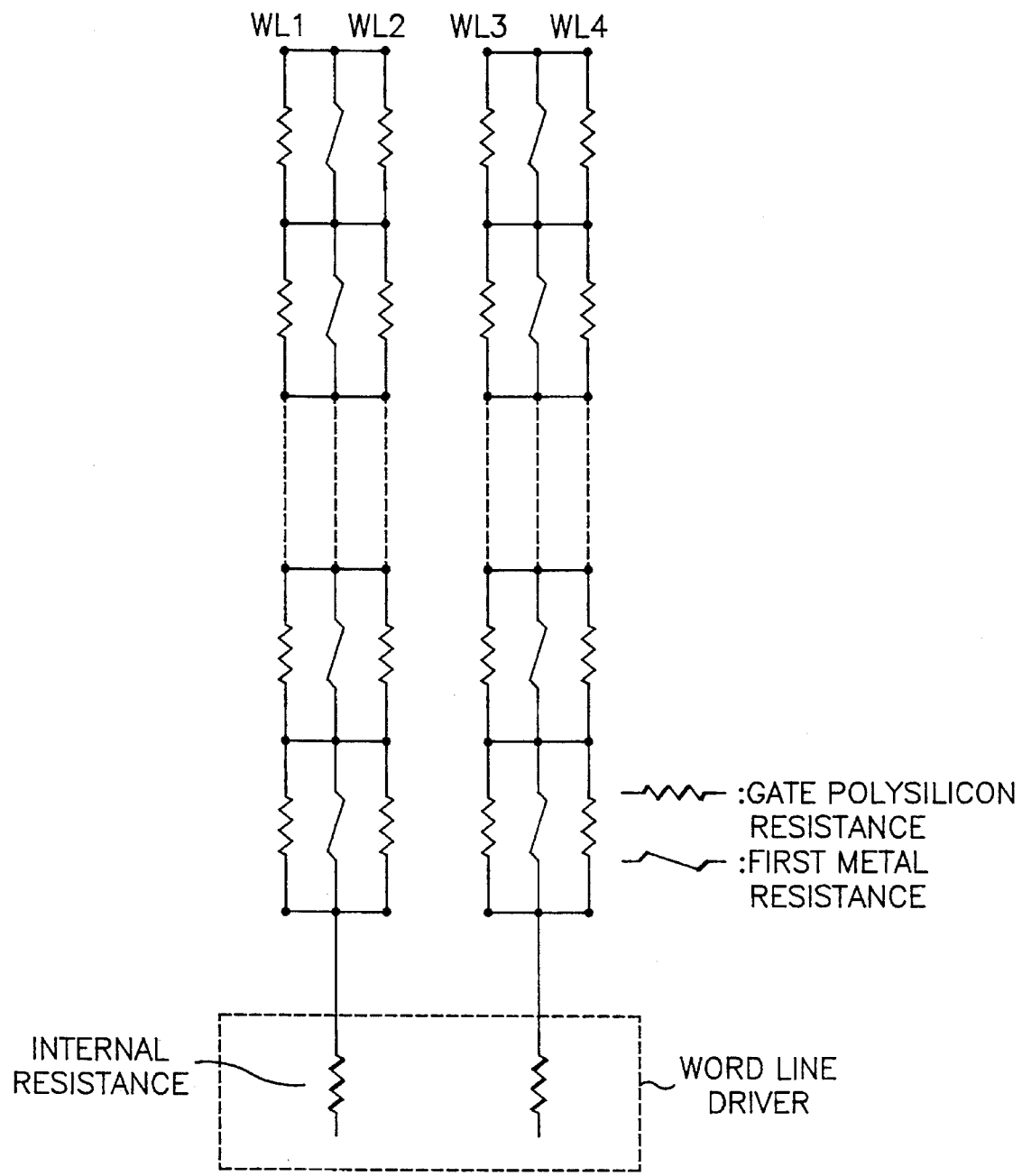
FIG. 4 is a schematic diagram illustrating the resistance components of the word lines of as shown FIG. 3.

It can be therefore readily appreciated that the improved word line and word line driver configuration constructed according to the present invention contemplates respectively connecting at least two corresponding word lines to a single driver in order to reduce the line resistance of the word lines, in response to the word line driver selection signals PX0, PX1, PX2, PX3 (of which only PX0 is shown) that are applied to the four word line drivers in the same group. By way of explanation, if the width of each one of the word lines, and the spacing between each of the word lines, are all identical in their dimensions, the line resistance between the word line straps is reduced to one third of the resistance of the conventional circuit having the same cell size and design talc, as is shown in FIG. 4, because when a word line driver is connected to two word lines, the resistance of the gate polycrystalline silicon layer is reduced to one-half of the resistance of the conventional circuit as shown in FIG. 1 by being coupled in parallel with the gate polycrystalline electrode of another memory cell coupled to the adjacent word line. Hence, due to this reduction in the effective resistance of the word lines, the delay time of the word line signal is minimized, which in turn, increases the speed of data sensing.

Figures 6A, 6B:
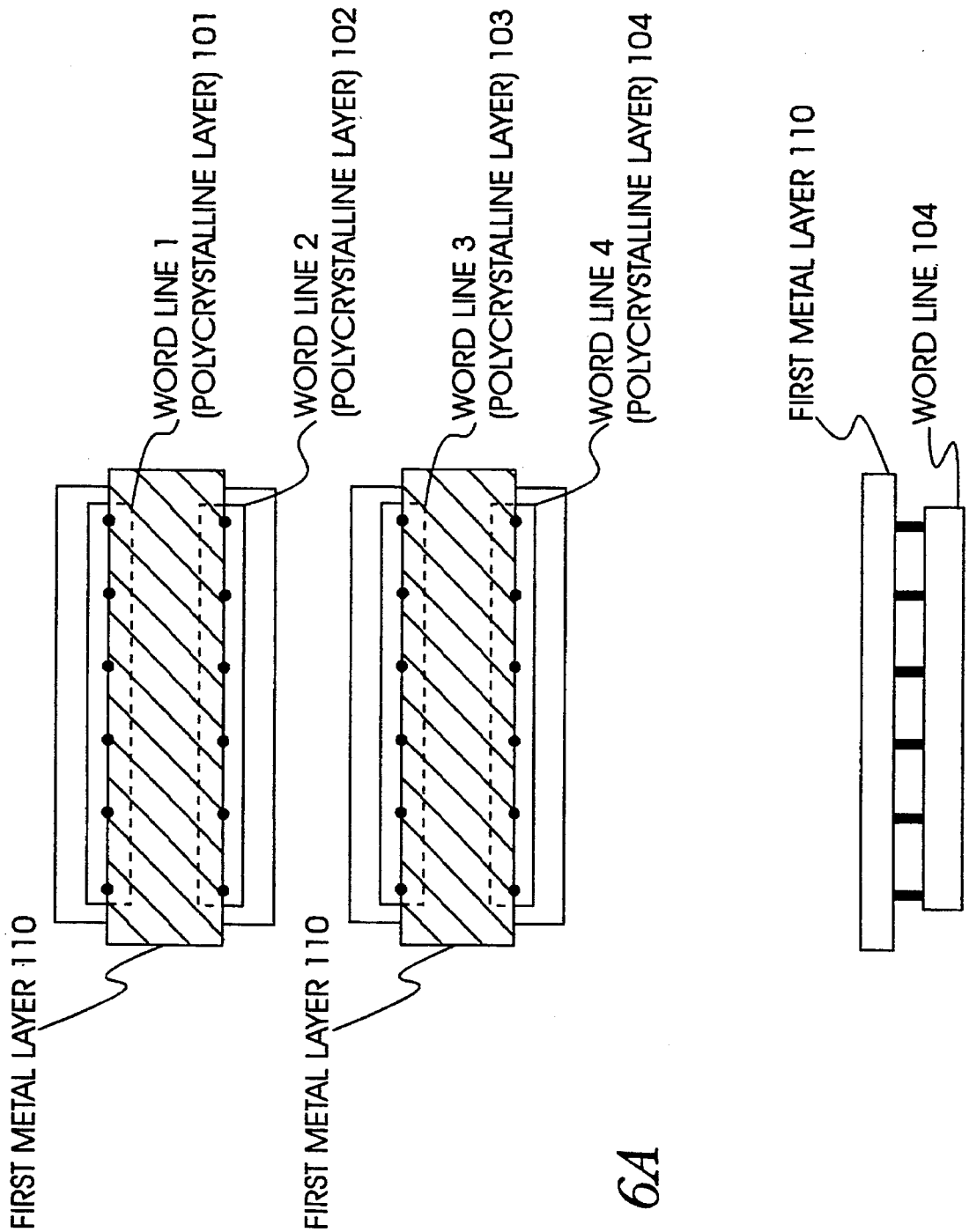
FIG. 6A illustrates an abstract representational plan view showing a detail in the fabrication of pairs of parallel word lines.
FIG. 6B illustrates a side view of the detail represented by FIG. 6A.

Turning now to FIGS. 6A and 6B, a process for making a semiconductor memory device which has an open bit structure, comprises of the steps of forming adjacent pairs of word lines with polycrystalline layers 101, 102, and 103, 104 of, for example, polycrystalline silicon, each comprising a plurality of serially coupled layers of polycrystalline silicon forming gate electrodes of a plurality of transistor memory cells. First metal layer 110 is formed, to extend substantially parallel to corresponding adjacent pairs of word lines 101, 102 and 103, 104, with adjacent, parallel lengths of metal layer 110 coupling each of the adjacent pairs of word lines to a different single word line driver. WD1 ... WD4. In essence, first metal layer 110 is deposited to form the word line proper that serially couples the polycrystalline silicon gate electrodes of the single transistors along each word line.

Although the present invention has been described with reference to one preferred embodiment, it will be readily appreciated by one skilled in this technical field that various modifications and changes may be made to the described embodiment without departing from the scope of the inven-

What is claimed is:

1. A semiconductor memory device, comprising:

a memory array formed as a matrix of memory cells and having a plurality of word lines, each one of said plurality of word lines accessing a different plurality of said memory cells; and a plurality of word line driving means for driving said plurality of word lines, each of said plurality of word line driving means being connected to select and drive at least two of said plurality of word lines.

2. The semiconductor memory device of claim 1, further comprised of the number of said plurality of word line driving means comprising one-half of a number of said plurality of word lines.

3. The semiconductor memory device of claim 1, further comprised of each of said plurality of word lines comprising:

polycrystalline silicon layers forming serially coupled gate electrodes of memory cells within said memory array; and layers of metal forming electrical shunts between different corresponding successive lengths of said polycrystalline silicon layers within each of said at least two of said plurality of word lines.

4. The semiconductor memory device of claim 1, wherein said each of said plurality of word line driving means simultaneously drives at least two adjacent of said plurality of word lines connected in parallel.

5. A semiconductor memory device having an open bit line structure, comprising:

a first plurality of parallel, spaced apart layers of a crystalline material defining a second plurality equal in number to one-half of said first plurality, of pairs of adjacent word lines; and a third plurality equal in number to said second plurality, of word line driver stages, each of said word line driver stages being coupled to a different one of said pairs of adjacent word lines.

6. A semiconductor memory device having an open bit line structure, comprising:

a first word line comprising a plurality of first, serially coupled word line resistances, said first word line accessing a first plurality of memory cells in a memory array;

a second word line comprising a plurality of second, serially coupled word line resistances, said second word line accessing a second plurality of memory cells in a memory array; and a single word line driver comprising a word line terminal connected to one end of said first word line and to one end of said second word line, for driving one of said first word line and said second word line in response to a word line selection signal and a driver selection signal.

7. The semiconductor memory device of claim 6, wherein said single word line driver simultaneously drives said first and second word lines connected in parallel.

8. A semiconductor memory device having an open bit line structure, comprising:

a memory array formed as a matrix of memory cells and a plurality of word lines, with each one of said word lines accessing a different plurality of said memory cells;

means for connecting two of said word lines in parallel, to a single word line driver; and means for driving one of said two word lines with said single word line driver in response to a word line selection signal and a driver selection signal.

9. The semiconductor memory device of claim 8, further comprised of said connecting means comprising means for reducing resistance of a gate polysilicon layer contributing to word line resistance by connecting said two word lines in parallel, to said single word line driver.

10. The semiconductor memory device of claim 8, further comprised of said connecting means comprising means for reducing resistance of a first metal layer contributing to word line resistance by connecting said two word lines in parallel, to said single word line driver.

11. The semiconductor memory device of claim 8, further comprised of said connecting means comprising means for reducing an internal resistance of said single word line driver when driving said one of said two word lines by connecting said two word lines in parallel, to said single word line driver.

12. A semiconductor memory device, comprising:

a plurality of memory cells;

a memory array formed as a matrix having a plurality of word lines with each of said word lines coupled to a different plurality of said memory cells; and a plurality of word line driving means for driving said plurality of word lines, each of said plurality of word line driving means being connected to simultaneously drive at least two adjacent of said plurality of word lines.

13. The semiconductor memory device as claimed in claim 12, further comprised of each pair of said plurality of word lines comprising a polycrystalline silicon layer forming serially coupled gate electrodes of a first plurality of memory cells, and the word lines forming each pair being connected to a different corresponding one of said plurality of word line driving means by a conduction layer.

14. A semiconductor memory device having an open bit line structure, comprising:

a plurality of bit lines;

a plurality of word lines formed by a plurality of serially coupled layers of polysilicon layers;

a plurality of memory cells connected to said plurality of bit lines and said plurality of word lines forming a memory array;

a plurality of word line driving means for driving said plurality of word lines, each of said plurality of word line driving means being connected to an adjacent pair of said plurality of word lines via a conduction layer to simultaneously drive said adjacent pair of said plurality of word lines; and word line selector means connected to said plurality of word line driving means, for making selection and enabling operation of a selected one of said plurality of word line driving means in dependence upon word line driver selection signals.

* * * * *

UNITED STATES PATENT AND TRADEMARK OFFICE
CERTIFICATE OF CORRECTION

PATENT NO. : 5,467,316
DATED : 14 November 1995
INVENTOR(S) : Hyeun- Su Kim, et al.

It is certified that error appears in the above-indentified patent and that said Letters Patent is hereby corrected as shown below:

Column 4,

Line 37    Change "talc" to --rule--.

Signed and Sealed this

Eighth Day of October, 1996

*Attest:*

BRUCE LEHMAN

*Attesting Officer*    Commissioner of Patents and Trademarks